(12) United States Patent
Kimura (10) Patent No.: US 7,382,158 B2
(45) Date of Patent: Jun. 3, 2008

(54) LEVEL SHIFTER CIRCUIT

(75) Inventor: Hiroyuki Kimura, Sendai (JP)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 11/867,006

(22) Filed: Oct. 4, 2007

(65) Prior Publication Data
US 2008/0088341 A1 Apr. 17, 2008

(30) Foreign Application Priority Data
Oct. 16, 2006 (JP) ............................. 2006-281811

(51) Int. Cl.
*H03K 19/0175* (2006.01)
(52) U.S. Cl. ............................. 326/81; 326/80; 326/68
(58) Field of Classification Search .................. 326/68, 326/80–81; 327/333
See application file for complete search history.

(56) References Cited
U.S. PATENT DOCUMENTS
5,561,384 A * 10/1996 Reents et al. ............... 327/108

2005/0285659 A1* 12/2005 Kanno et al. ............... 327/333

FOREIGN PATENT DOCUMENTS
JP 8307242 A 11/1996
JP 2005033530 A 2/2005

* cited by examiner

*Primary Examiner*—Anh Q Tran
(74) *Attorney, Agent, or Firm*—Charles Bergere (57) ABSTRACT

A level shifter circuit for ensuring a high impedance state even in a transitional period such as when activating an external power supply while reducing power consumption. A latch circuit is set to a low level by a set circuit when a high potential power supply voltage increases. When the high potential power supply voltage exceeds a threshold voltage, a p-channel MOS transistor of the latch circuit is activated and the high potential power supply voltage is applied to a first transistor via a connection node. When a high potential enable signal having normal high level signal voltage is provided to a second transistor, which is connected to the first transistor, the reset circuit provides the high level signal to the latch circuit and stops the voltage application to the first transistor via the connection node.

9 Claims, 4 Drawing Sheets

FIG. 4
—PRIOR ART— ions that perform a three-state

LEVEL SHIFTER CIRCUIT

BACKGROUND OF THE INVENTION

The present invention relates to a level shifter circuit for converting a voltage of a high level input signal into a high voltage in accordance with the input signal and outputting the high voltage and for further outputting a high impedance state using an output enable signal.

A level shifter circuit is known as a circuit for converting a low voltage signal to a high voltage signal. The level shifter circuit includes a circuit that performs a three-state output. The three states include low level output performed in accordance with the input level, high level output performed in accordance with the input level, and high impedance state output. The level shifter circuit for outputting three states includes a circuit that uses an output enable signal to determine whether to perform an output corresponding to the input level or a high impedance state output (refer to, for example, FIG. 1 of Japanese Laid-Open Patent Publication No. 2005-33530, and FIG. 2 of Japanese Laid-Open Patent Publication No. 8-307242).

Japanese Laid-Open Patent Publication No. 2005-33530 and Japanese Laid-Open Patent Publication No. 8-307242 each describe a level shifter circuit including an n-channel MOS transistor, which controls connection between an output terminal and a ground voltage line, and a p-channel MOS transistor, which controls connection between the output terminal and a high potential power supply voltage line. The level shifter circuit activates and deactivates the n-channel MOS transistor and the p-channel transistor in accordance with an output enable signal and an input signal to determine the output. The p-channel MOS transistor is activated when its gate terminal is provided with a signal having a low level.

In the level shifter circuit of Japanese Laid-Open Patent Publication No. 2005-33530, the high potential power supply voltage line is connected to the gate terminal of the p-channel MOS transistor via a resistor. Thus, current is consumed by the resistor when maintaining the output of the high potential power supply voltage. This increases the power consumption. In this level shifter circuit, the n-channel MOS transistor is arranged between the n-channel MOS and the output terminal, and the p-channel MOS transistor is arranged between the p-channel. MOS transistor and the output terminal. This decreases the difference of the voltage applied to the transistors and suppresses the voltage to below the gate withstand voltage and the drain-source withstand voltage of each transistor. Thus, reliable operation of the level shifter circuit is ensured even when using a transistor of which the gate withstand voltage or the drain-source withstand voltage is not large.

In the level shifter circuit disclosed in Japanese Laid-Open Patent Publication No. 8-307242, the gate terminal of the p-channel MOS transistor is biased by two inverters, which are connected in series. The inverters use the high potential power supply voltage line as a power supply. Thus, the voltage at the gate terminal and the voltage at the source terminal of the p-channel can be substantially equalized. This reduces the power consumption.

However, the p-channel MOS transistor is not always deactivated during a transitional period such as when an external power supply is activated. In other words, in such level shifter circuits, a high impedance state cannot be maintained when the voltage rises.

Figure 4:
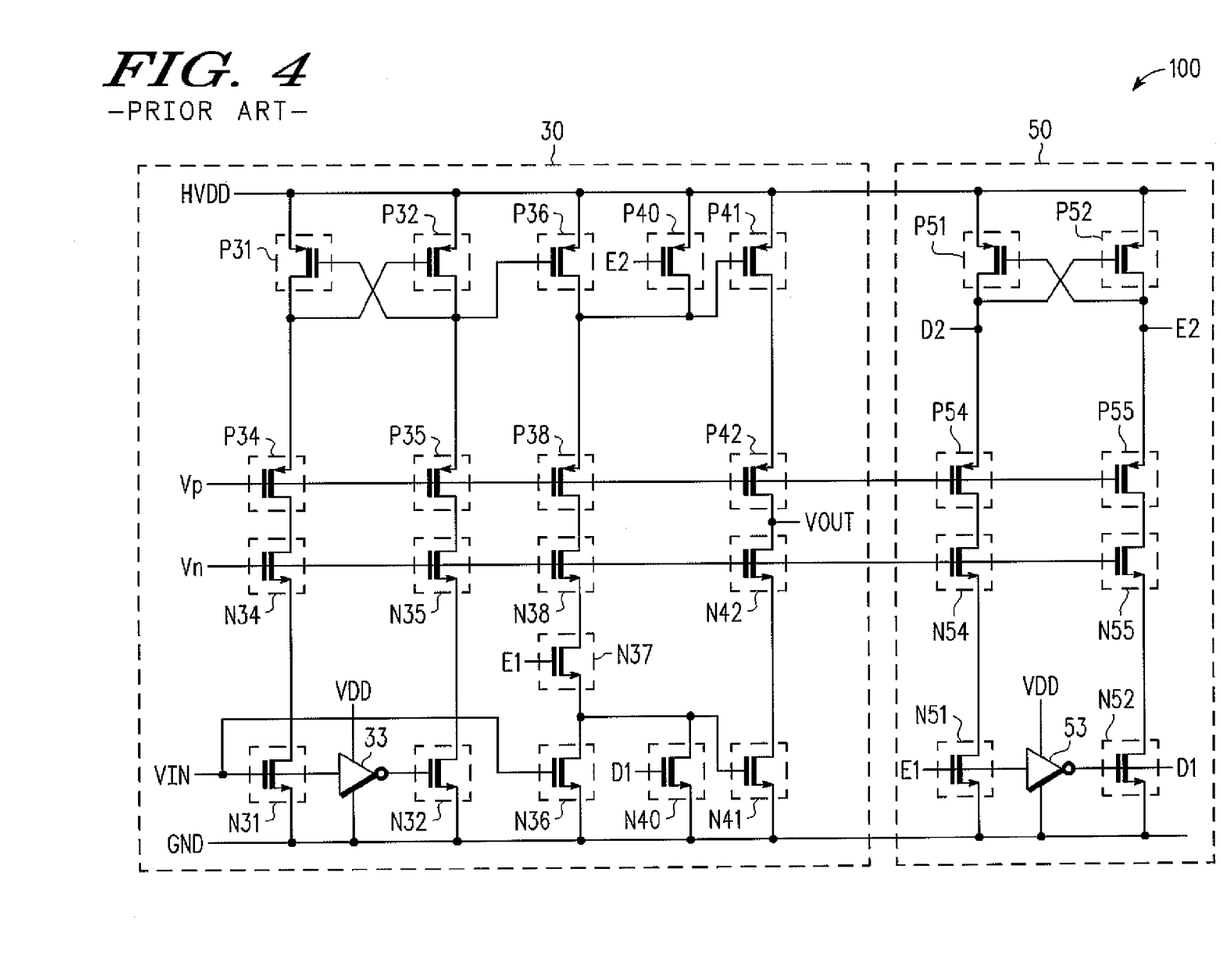
FIG. 4 is a circuit diagram of a level shifter circuit in the prior art.

The level shifter circuit 100 shown in FIG. 4 may also be used. The level shifter circuit 100 includes an input signal level shifter circuit 30 and an enable signal level shifter circuit 50. In this level shifter circuit 100, the output enable signal is set to a high level signal when outputting an output signal with a voltage corresponding to the input signal, and the output enable signal is set to a low level signal when the output is in the high impedance state.

The input signal level shifter circuit 30 outputs an output signal corresponding to the input signal when the output enable signal has a low level. Specifically, when the input signal has a low level, the input signal level shifter circuit 30 outputs the ground voltage GND, which has the same voltage as the input signal as an output voltage VOUT, or as a signal having the same low level as the input signal. Furthermore, when the input signal has a high level, a high potential power supply voltage HVDD, which has a higher voltage than the input signal, is output as the output voltage VOUT of a high level signal corresponding to the input signal.

Furthermore, when the output enable signal E1 has a high level, the enable signal level shifter circuit 50 outputs a signal (hereinafter referred to as high potential enable signal E2) having a level corresponding to the output enable signal, that is, a voltage higher than the voltage of the output enable signal E1. The enable signal level shifter circuit 50 also outputs an inverted signal of the output enable signal (output disable signal D1) and a signal (hereinafter high potential disable signal D2) having a level corresponding to the output disable signal. The high potential disable signal D2 has a voltage that is higher than the voltage of the output disable signal D1.

The input signal level shifter circuit 30 will now be described in detail.

As shown in FIG. 4, the input terminal of the level shifter circuit 100, to which input voltage VIN is applied, is connected to the gate terminal of a transistor N31, the input terminal of an inverter 33, and the gate terminal of a transistor N36 in the input signal level shifter circuit 30.

The transistor N31 is an n-channel MOS transistor, the source terminal of which is connected to the ground voltage GND line. The drain terminal of the transistor N31 is connected to the high potential power supply voltage HVDD line via a transistor N34, a transistor P34, and a transistor P31.

A low potential power supply voltage VDD is supplied to the inverter 33 serving as driving voltage. The output terminal of the inverter 33 is connected to the gate terminal of the transistor N32. The inverter 33 outputs the inverted signal of the input signal (high level signal of the low potential power supply voltage VDD or low level signal of the ground voltage GND).

The transistor N32 is an n-channel MOS transistor, the source terminal of which is connected to the ground voltage GND line. The drain terminal of the transistor N32 is connected to the high potential power supply voltage HVDD line via a transistor N35, a transistor P35, and a transistor P32.

The transistors N34 and N35 are n-channel MOS transistors, the gate terminals to which a voltage Vn having a fixed value is applied in a normal state. The voltage Vn is a voltage that activates the n-channel MOS transistor having the source terminal to which the ground voltage GND is applied. Further, the voltage Vn is higher than the ground voltage GND by about 3 V. The transistors P34 and P35 are p-channel MOS transistors, the gate terminals to which a voltage Vp having a fixed value is applied in a normal state. The voltage Vp is a voltage that activates the p-channel MOS transistor having the source terminal to which the high potential power supply voltage HVDD is applied. The voltage Vp is a voltage lower than the high potential power supply voltage HVDD by about 3 V. In the preferred embodiment, the voltage Vp is higher than the voltage Vn. When the high potential power supply voltage HVDD is small, the relation of the voltages Vp and Vn with respect to magnitude is reversed.

The transistors P31 and P32 are p-channel MOS transistors. The source terminals of the transistors P31 and P32 are connected to the high potential power supply voltage HVDD line. The source of the transistor P34 and the gate terminal of the transistor P32 are connected to the drain terminal of the transistor P31. The source terminal of the transistor P35 and the gate terminal of the transistor P31 are connected to the drain terminal of the transistor P32. The gate terminal of a transistor P36 is also connected to the drain terminal of the transistor P32.

The transistor P36 is a p-channel MOS transistor, the source terminal of which is connected to the high potential power supply voltage HVDD line. The drain terminal of the transistor P36 is connected to the drain terminal of a transistor P40 serving as a first switch element and the gate terminal of a transistor P41 serving as a first output control element.

The transistors P40 and P41 are p-channel MOS transistors, the source terminals of which are connected to the high potential power supply voltage HVDD line. The high potential enable signal E2 is provided to the gate terminal of the transistor P40. The voltage of the high potential enable signal E2 becomes the high potential power supply voltage HVDD when the output enable signal E1 has a high level. When the output disable signal D1 has a high level and a transistor P52 is deactivated, the high potential enable signal E2 decreases until a transistor P55 is deactivated, and becomes the voltage determined by the voltage Vp and the threshold voltage Vthp of a transistor P38 (about "voltage Vp+threshold voltage Vthp"). The transistor P41 is connected via the transistor P42 to the output terminal that outputs the output voltage VOUT. The transistor P42 is a p-channel MOS transistor having a gate terminal to which the voltage Vp is applied.

The drain terminal of the transistor P36 is connected to the ground voltage GND line via the transistor P38, a transistor N38, a transistor N37, and the transistor N36. The transistor P38 p-channel MOS transistor having a gate terminal to which voltage Vp is applied. The transistor N38 is an n-channel MOS transistor having a gate terminal to which voltage Vn is applied. The transistor N37 is an n-channel MOS transistor, the gate terminal of which is provided with the output enable signal E1.

The transistor N36 is an n-channel MOS transistor having a gate terminal to which the input voltage VIN is applied, a source terminal connected to the ground voltage GND line, and a drain terminal connected to the source terminal of the transistor N37. The drain terminal of the transistor N36 is also connected to the drain terminal of a transistor N40 serving as a second switch element and the gate terminal of a transistor N41 serving as a second output control element. The transistors N40 and N41 are n-channel MOS transistors, the source terminals of which are connected to the ground voltage GND line.

The output disable signal D1 is provided to the gate terminal of the transistors N40. The transistor N41 is connected via a transistor N42 to the output terminal that outputs the output voltage VOUT. The transistor N42 is an n-channel MOS transistor having a gate terminal to which the voltage Vn is applied.

The enable signal level shifter circuit 50 will now be described in detail.

As shown in FIG. 4, the output enable signal E1 is provided to the gate terminal of a transistor N51 and to the input terminal of an inverter 53 in the enable signal level shifter circuit 50.

The transistor N51 is an n-channel MOS transistor having a source terminal connected to the ground voltage GND line and a drain terminal connected to the high potential power supply voltage HVDD line via a transistor N54, a transistor P54, and a transistor P51.

The inverter 53 is supplied with low voltage power supply voltage VDD serving as driving voltage. The output terminal of the inverter 53 is connected to the gate terminal of a transistor N52. The output terminal of the inverter 53 outputs the inverted signal of the output enable signal E1. The output signal from the inverter 53 becomes the output disable signal D1.

The transistor N52 of which gate terminal is connected to the output terminal of the inverter 53 is an n-channel MOS transistor. The transistor N52 has a source terminal connected to the ground voltage GND line and a drain terminal connected to the high potential power supply voltage HVDD line via a transistor N55, a transistor P55, and a transistor P52.

The transistors N54 and N55 are n-channel MOS transistors having gate terminals to which the voltage Vn is applied. The transistors P54 and P55 are p-channel MOS transistors having gate terminals to which the voltage Vp is applied.

The transistors P51 and P52 are p-channel MOS transistors. The source terminals of the transistors P51, P52 are connected to the high potential power supply voltage HVDD line. The source terminal of the transistor P54 and the gate terminal of the transistor P52 are connected to the drain terminal of the transistor P51. A signal from the drain terminal of the transistor P51 becomes the high potential disable signal D2. The source terminal of the transistor P55 and the gate terminal of the transistor P51 are connected to the drain terminal of the transistor P52. A signal from the drain terminal of the transistor P52 becomes the high potential enable signal E2.

When setting the level shifter circuit 100 to the high impedance state, the output enable signal E1 is set to a low level. This shifts the output disable signal D1 to a high level, activates the transistor N40, and the voltage at the drain terminal of the transistor N40 becomes the ground voltage GND. As a result, the voltage of the gate terminal of the transistor N41 also becomes the ground voltage GND. This deactivates the transistor N41.

When the output enable signal E1 is set to the low level, the high potential enable signal E2 also shifts to a low level. Therefore, voltage having a low level is applied to the gate terminal of the transistor P40. This activates the transistor P40 and the voltage at the drain terminal of the transistor P40 becomes the high potential power supply voltage HVDD. This results in the voltage at the gate terminal of the transistor P41 becoming the high potential power supply voltage HVDD. Thus, the transistor P41 is deactivated.

The transistor N37 of which gate terminal receives the output enable signal E1 is deactivated. As a result, current does not flow through the transistor P40 and the transistor N40. Thus, the voltage at the drain terminal of the transistor P40 approaches the high potential power supply voltage HVDD, and the voltage at the drain terminal of the transistor N40 approaches the ground voltage GND. This ensures that the high impedance is maintained.

In this manner, when the output enable signal is set to low level, the transistors N41 and P41 on both sides of the output terminal are deactivated. Thus, the level shifter circuit 100 enters the high impedance state.

In the level shifter circuit 100 shown in FIG. 4, the transistor P41 must be deactivated to obtain the high impedance state, as described above. Thus, in the level shifter circuit 100, the transistor P40 is activated to apply the high potential power supply voltage HVDD to the gate terminal of the transistor P41. Then, the high potential power supply voltage HVDD is applied to the gate terminal of the transistor P41, and the transistor P41 is deactivated. Furthermore, the high potential enable signal E2 is provided to the gate terminal of the transistor P40 to activate the transistor P40.

During activation of the power supply, the voltage value of the high potential enable signal E2 and the voltage value of the high potential disable signal D2 in the level shifter circuit 100 may be unstable when the voltages Vn and Vp have not yet been supplied even though circuits operated by low voltages such as the low potential power supply voltage VDD have already been activated. In this case, when the voltages of the high potential enable signal E2 and the high potential disable signal D2 are close to the high potential power supply voltage HVDD, activation of the transistor P40 cannot be ensured. As a result, the transistor P41 may not be deactivated. Accordingly, the high potential power supply voltage HVDD may not be applied to the gate terminal of the transistor P41 depending on the input signal. Thus, the level shifter circuit 100 may not enter the high impedance state even though the output enable signal E1 has a low level.

SUMMARY OF THE INVENTION

It is an object of the present invention to provide a level shifter circuit that ensures a high impedance state even in a transitional period such as when an external power supply is activated, while reducing the power consumption.

One aspect of the present invention is a level shifter circuit including a first output control element formed by a p-channel MOS transistor arranged between an output terminal and a high potential power supply voltage line. A second output control element is formed by an n-channel MOS transistor arranged between the output terminal and a reference voltage line. A first switch element controls connection between a gate terminal of the first output control element and the high potential power supply voltage line in accordance with an output enable signal for performing an output corresponding to an input signal. A second switch element controls connection between a gate terminal of the second output control element and the reference voltage line in accordance with an output disable signal for realizing a high impedance state. When the output enable signal has a high level and the input signal has a high level, a voltage higher than voltage of the input signal is output from the output terminal. The level shifter is characterized by a high impedance holding means including a set means and a reset means. The set means applies high potential power supply voltage to the gate terminal of the first output control element when the high potential power supply voltage exceeds a threshold voltage of the first output control element. The reset means stops the application of the high potential power supply voltage to the gate terminal of the first output control element when the first switch element starts control.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A level shifter circuit 10 according to a preferred embodiment of the present invention will now be described with reference to FIGS. 1 to 3. In the level shifter circuit 10 of the preferred embodiment, like or same reference numerals are given to those components that are the same as the corresponding components in the level shifter circuit 100 shown in FIG. 4. Such components will not be described in detail.

Figure 1:
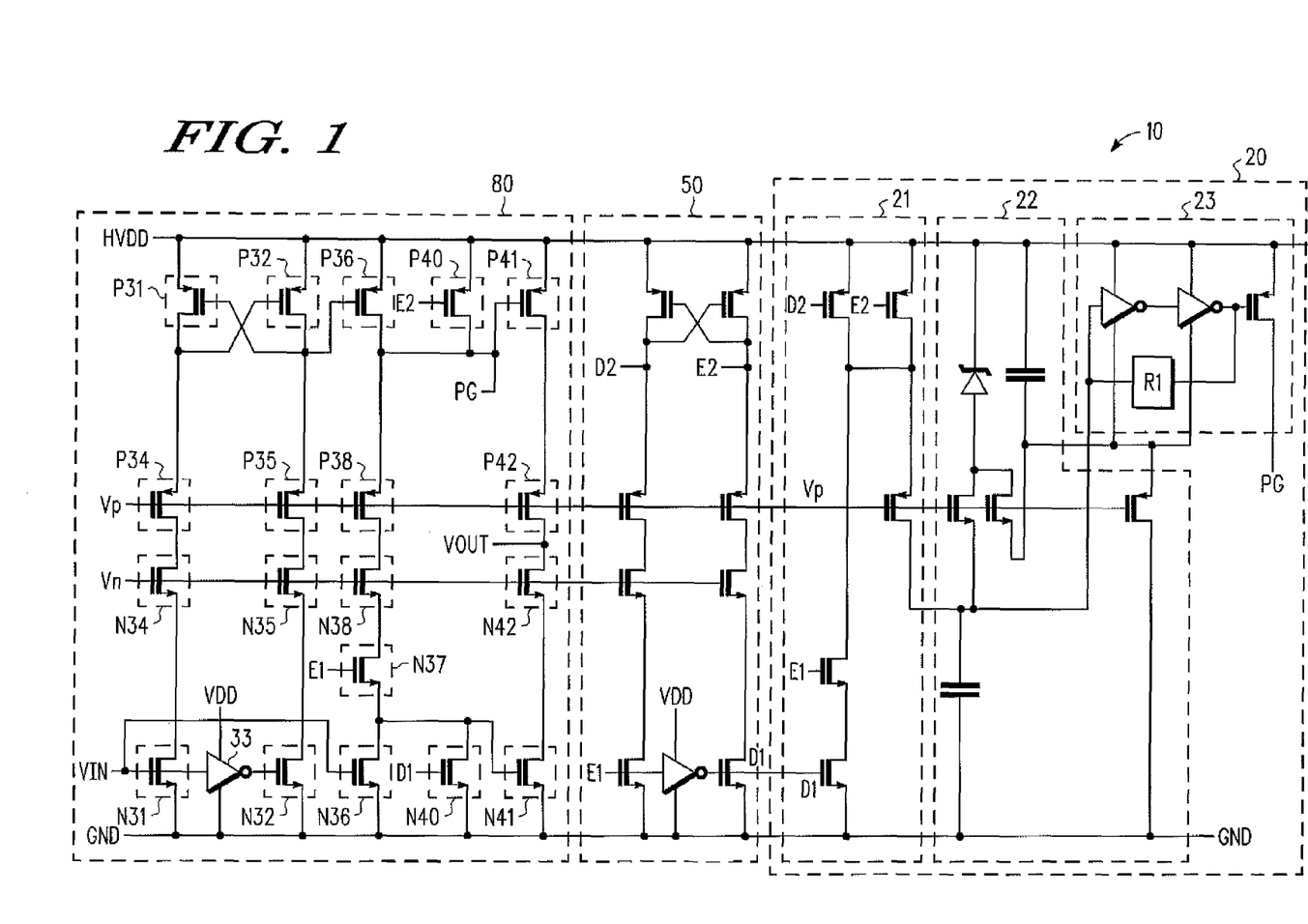
FIG. 1 is a circuit diagram of a level shifter circuit according to a preferred embodiment of the present invention.
Figure 2:
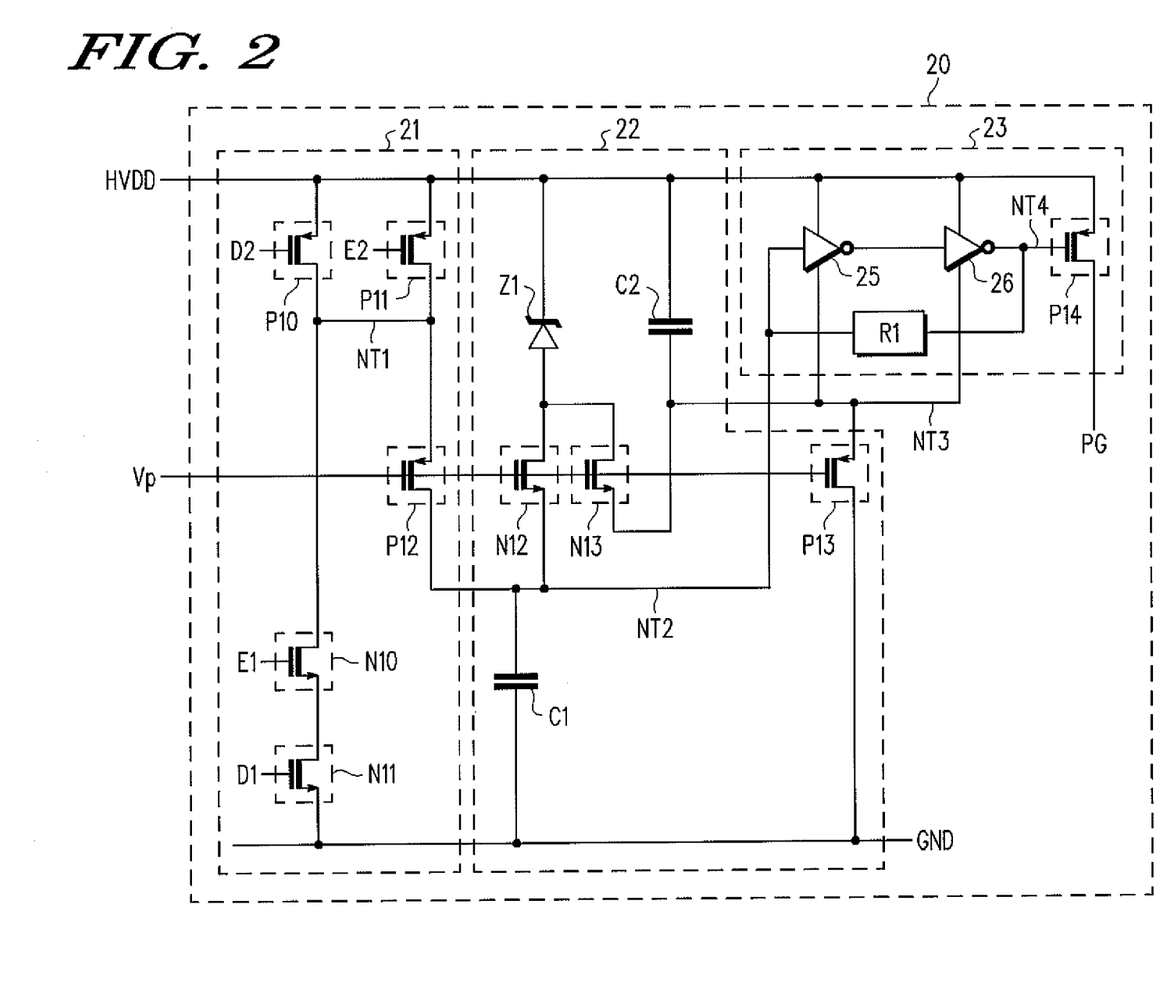
FIG. 2 is an enlarged wiring diagram of a high impedance holding circuit, which is the main part of the present invention.

FIG. 1 shows the level shifter circuit 10 of the preferred embodiment. The level shifter circuit 10 is in a high impedance state when provided with an output enable signal E1 having a low level and outputs a low level or high level signal corresponding to the input signal when provided with an output enable signal E1 having a high level (so-called three states).

The level shifter circuit 10 uses ground voltage GND serving as a reference voltage, low potential power supply voltage VDD, and high potential power supply voltage HVDD. Specifically, in the preferred embodiment, the level shifter circuit 10 operates using the ground voltage GND of 0 V, the low potential power supply voltage VDD of 3 V, and the high potential power supply voltage HVDD of 5 V. The low potential power supply voltage VDD and the high potential power supply voltage HVDD, which are supplied from an external power supply of the level shifter circuit 10, is 0 V when power is not supplied from the external supply.

An input voltage VIN applied to the level shifter circuit 10 has the ground voltage GND when having a low level and the low potential power supply voltage VDD when having a high level. When the level shifter circuit 10 is not in the high impedance state, the level shifter circuit 10 outputs the ground voltage GND when the input signal is a low level signal and outputs the high potential power supply voltage HVDD as the output voltage VOUT when the input signal is a high level signal. Accordingly, the levels shifter circuit 10 outputs the low potential power supply voltage VDD of the input voltage VIN as the high potential power supply voltage HVDD of the output voltage VOUT when the input signal has a high level.

The level shifter circuit 10 of the preferred embodiment includes an input signal level shifter circuit 80, an enable signal level shifter circuit 50, and a high impedance holding circuit 20.

The input signal level shifter circuit 80 has substantially the same configuration as the input signal level shifter circuit 30 of the prior art shown in FIG. 4. The input signal level shifter circuit 80 of the preferred embodiment differs from the input signal level shifter circuit 30 of the prior art in that a connection node PG is arranged at the gate terminal of the transistor P41. The output terminal of the high impedance holding circuit 20 serving as the high impedance holding means is connected to the connection node PG. The connection node PG will be described in relation with the high impedance holding circuit 20.

The enable signal level shifter circuit 50 has the same configuration as the enable signal level shifter circuit 50 of the prior art shown in FIG. 4 and thus will not be described in detail.

The high impedance holding circuit 20 of the present invention will now be described with reference to FIG. 2. The high impedance holding circuit 20 controls the voltage at the connection node PG connected to the gate terminal of the transistor P41 to maintain the high impedance state of the level shifter circuit 10 even when in a transitional period, such as when an external power supply is activated.

The high impedance holding circuit 20 of the preferred embodiment includes a reset circuit 21 serving as a reset means, a set circuit 22 serving as a set means, and a latch circuit 23 serving as a latch means. The latch circuit 23 maintains control in a constant state even when the voltage fluctuates. The set circuit 22 sets the latch circuit 23 when the voltage of the high potential enable signal E2 is low such as during activation of the power supply. The reset circuit 21 resets the latch circuit 23 when the voltage of the high potential enable signal E2 becomes sufficiently high.

The reset circuit 21 includes a transistor P11 and a transistor P12, which are connected in series. The transistors P11 and P12 are p-channel MOS transistors.

The transistor P11 functions as a second reset control element and includes a source terminal connected to the high potential power supply voltage HVDD line and a gate terminal is provided with a high potential enable signal E2.

The source terminal of the transistor P12 is connected to the drain terminal of the transistor P11. The transistor P12 functions as a second shift element and has a gate terminal to which the voltage Vp is applied. The drain terminal of the transistor P12 is connected to the input terminal of the set circuit 22 via a connection net NT2. Thus, when the high potential enable signal E2 is sufficiently decreased and the transistor P11 is activated during the activation of the power supply, the high potential power supply voltage HVDD is applied to the source terminal of the transistor P12 and the transistor P12 is also activated.

A transistor P10 formed by a p-channel MOS transistor is arranged in parallel with the transistor P11. The transistor P10 functions as a reset control element. Specifically, the transistor P10 has a source terminal connected to the high potential power supply voltage HVDD line and a drain terminal connected to the drain terminal of the transistor P11. In FIG. 2, the portion connecting the drain terminal of the transistor P10 and the drain terminal of the transistor P11 is indicated as a connection net NT1. Furthermore, a high potential disable signal D2 is provided to the gate terminal of the transistor P10. The transistor P11 raises the potential at the connection net NT1 when either one of transistor N10 and N11, which will be described below, is deactivated even if the transistor P10 is deactivated. The latch circuit 23 is reset before shifting to a normal operation. Thus, the normal operation is not affected by the resetting even if the reset circuit 21 causes a delay.

The connection net NT1 is connected to the ground voltage GND line via the transistors N10 and N11. The transistors N10 and N11 are compensation elements having gate terminals provided with an output enable signal E1 and an output disable signal D1, respectively.

The high potential enable signal E2 and the high potential disable signal D2 each take an intermediate value and does not become a completely low level voltage during activation of the external power supply. In this case, the voltages of the output enable signal E1 and the output disable signal D1 also take an intermediate voltage between the high level and low level in a state in which the transistors P10, P1, P51, and P52 are not completely activated or deactivated and the transistors N54, N55, P54, and P55 are also in an incomplete state. Thus, the transistors N10 and N11, the gate terminals of which are respectively provided with the output enable signal E1 and the output disable signal D1, are in a weakly activated state (high resistance state). In this case, leakage current of the transistors P10 and P11 flows through the transistors N10 and N11 and lowers the potential at the connection net NT1. This prevents the voltage at the source terminal of the transistor P12 from becoming high until the transistor P12 is activated in a reset state. The reset state refers to a state in which the enable signal level shifter circuit 50 performs a normal operation and the "high potential power supply voltage HVDD–voltage Vp" becomes higher than the threshold voltage Vthp and thereby activates the transistor P12 is activated.

The set circuit 22 includes a transistor N12, a transistor N13, and a transistor P13. The transistors N12 and N13 are n-channel MOS transistors and respectively function as a first shift element and a fourth shift element. The transistor P13 is a p-channel MOS transistor and functions as a third shift element.

The drain terminals of the transistors N12 and N13 are connected to an anode of a Zener diode Z1 serving as a release means. The cathode of the Zener diode Z1 is connected to the high potential power supply voltage HVDD line. Current flows through the Zener diode Z1 even if voltage greater than or equal to the Zener voltage is applied from the cathode to the anode. The Zener diode Z1 that is employed has a Zener voltage VZ that is greater than the threshold voltage Vthp of the p-channel MOS transistor, enables operation of the latch circuit 23, and is lower than or equal to the withstand voltage of the latch circuit 23 (e.g., about 2V).

The source terminal of the transistor N12 is connected to the ground voltage GND line via a capacitor C1 that forms a voltage generating means. The capacitor C1 stabilizes the voltage and is sized to absorb voltage fluctuations. Voltage fluctuations are caused by leakage current generated when the transistor P12 is activated even though the transistor P12 is not in a reset state and activated, charge current flowing to the gate terminal of the transistor P14, and charge current flowing to the input capacitor of the inverter 25. This further ensures that the low level signal is without raising the potential at the connection net NT2 even if the transistor P12 is activated but not reset. The capacitor C1 is used as the power supply of the latch circuit 23.

The source terminal of the transistor N12 is connected via the connection net NT2 to the input terminal of the latch circuit 23 and to the drain terminal of the transistor P12 of the reset circuit 21. Therefore, from the relationship of the voltage at the connection net NT2 and the voltage Vp, the transistor N12 is deactivated, and the anode of the Zener diode Z1 and the connection net NT2 are disconnected when the transistor P12 of the reset circuit 21 is activated.

The source terminal of the transistor N13 is connected to a connection net NT3 and to the high potential power supply voltage HVDD line via a capacitor C2, which forms the voltage generating means. The capacitor C2 stabilizes the voltage, and the charges of the capacitor C2 are used as the power supply of the latch circuit 23. In the preferred embodiment, electrostatic capacitance of the capacitor C2 is assumed to be sufficiently smaller than the electrostatic capacitance of the capacitor C1.

The source terminal of the transistor N13 is connected to the source terminal of the transistor P13 via the connection net NT3. The drain terminal of the transistor P13 is connected to the ground voltage GND line. Thus, if the voltage of the capacitor C2 becomes lower than "high potential power supply voltage HVDD−voltage Vp−threshold voltage Vthp" when the voltage Vp is supplied to the gate terminal of the transistor P13, the transistor is activated. This connects the connection net NT3 and the ground GND line are thereby decreases the potential at the connection net NT3.

Furthermore, the voltage Vp is supplied to the gate terminal of the transistor P13 in the same manner as the gate terminal of the transistor N13. Thus, only one of transistors N13 and P13 is switched to the activated state from the relationship of the voltage Vp and the connection net NT3.

The latch circuit 23 includes two inverters 25 and 26, which are connected in series, a resistor element R1, and a transistor P14 serving as a third switch element. The input terminal of the inverter 25 serves as an input terminal of the latch circuit 23 and is connected to the connection net NT2. The output terminal of the inverter 25 is connected to the input terminal of the inverter 26. The inverters 25 and 26 are connected to the high potential power supply voltage HVDD line serving as an inverter drive voltage line and the connection net NT3 serving as an inverter reference voltage line. That is, the inverters 25 and 26 use the high potential power supply voltage HVDD when outputting the high level signal and use the voltage at the connection net NT3 when outputting the low level signal.

The resistor element R1 is connected to the input terminal of the inverter 25 and the output terminal of the inverter 26 so as to be parallel to the series-connected inverters 25 and 26.

The output terminal of the inverter 26 is connected to the gate terminal of the transistor P14 serving as the third switch element. The connection between the output terminal of the inverter 26 and the gate terminal of the transistor P14 is indicated as a connection net NT4 in FIG. 2. The transistor P14 is a p-channel MOS transistor, the source terminal of which is connected to the high potential power supply voltage HVDD line. The drain terminal of the transistor P14 is the connection node PG and connected to the gate terminal of the transistor P41 of the input signal level shifter circuit 80 described above.

The operation during activation of the power supply of the level shifter circuit 10 will now be described with reference to FIG. 3. In the preferred embodiment, the n-channel MOS transistors (N10 to N13, N31, N32, N34 to N38, N40 to N42, N51, N52, N54, and N55) used in the level shifter circuit 10 are assumed to have the same threshold voltage Vthn. The p-channel MOS transistors (P10 to P14, P31, P32, P34 to P36, P38, P40 to P42, P51, P52, P54, and P55) used in the level shifter circuit 10 are also assumed to have the same threshold voltage Vthp. Furthermore, the inverters 25, 26, 33, and 53 used in the preferred embodiment operate when the potential difference between the power supply terminal and the reference voltage connection terminal exceeds the greater one of the threshold voltage Vthp and Vthn and perform the originally intended operation when the potential difference becomes greater than or equal to the voltage (Vthp+Vthn) of the sum of such threshold voltages. In the preferred embodiment, the threshold voltage Vthp of the p-channel MOs transistor is assumed to be slightly higher than the threshold voltage Vthn of the n-channel MOS transistor.

It is assumed here that the output enable signal E1 is set to a low level when the high impedance state is achieved during activation of the power supply. Further, it is assumed that in the level shifter circuit 10 of the preferred embodiment, when the external power supply is activated, the voltages (high potential power supply voltage HVDD, low potential power supply voltage VDD, voltage Vp, input voltage VIN during high level) other than a voltage having a low level and the voltage Vn that become a fixed value in the normal state rises with the same time constant. In the preferred embodiment, the voltage Vp is set so as to overshoot and then decrease to become a fixed value in the normal state. In the preferred embodiment, the voltage Vn is set so that when it rises, it exceeds the threshold voltage Vthn of the n-channel MOS transistor after the inverters (25, 26, 33, and 53) start operating.

When the external power supply is disconnected and the voltage decreases after the enable signal level shifter circuit 50 starts normal operation, the high potential power supply voltage HVDD decreases and becomes 0 V. In this case, the voltage Vp decreases while maintaining a predetermined potential difference with the high potential power supply voltage HVDD due to the charges between the high potential power supply voltage HVDD and the voltage Vp, and the voltage Vp ultimately becomes approximately 0 V. During this process, the transistor (P55 or P54) is deactivated when the voltage of the high potential enable signal E2 or the high potential disable signal D2 becomes lower than the "voltage Vp+threshold voltage Vthp". When the high potential power supply voltage HVDD in the initial state is 0 V, the charges are retrieved from the gate terminal of the transistor N41 to an extent that the transistor N41 is deactivated.

In the level shifter circuit 10, the potential at the high potential power supply voltage HVDD is 0 V before the external power supply is activated. The connection nets NT2 and NT3 of the high impedance holding circuit 20 are connected to the high potential power supply voltage HVDD line via the Zener diode Z1. Therefore, if the high potential power supply voltage HVDD is 0 V, voltage at the connection nets NT2, NT3 is 0 V.

Figure 3:
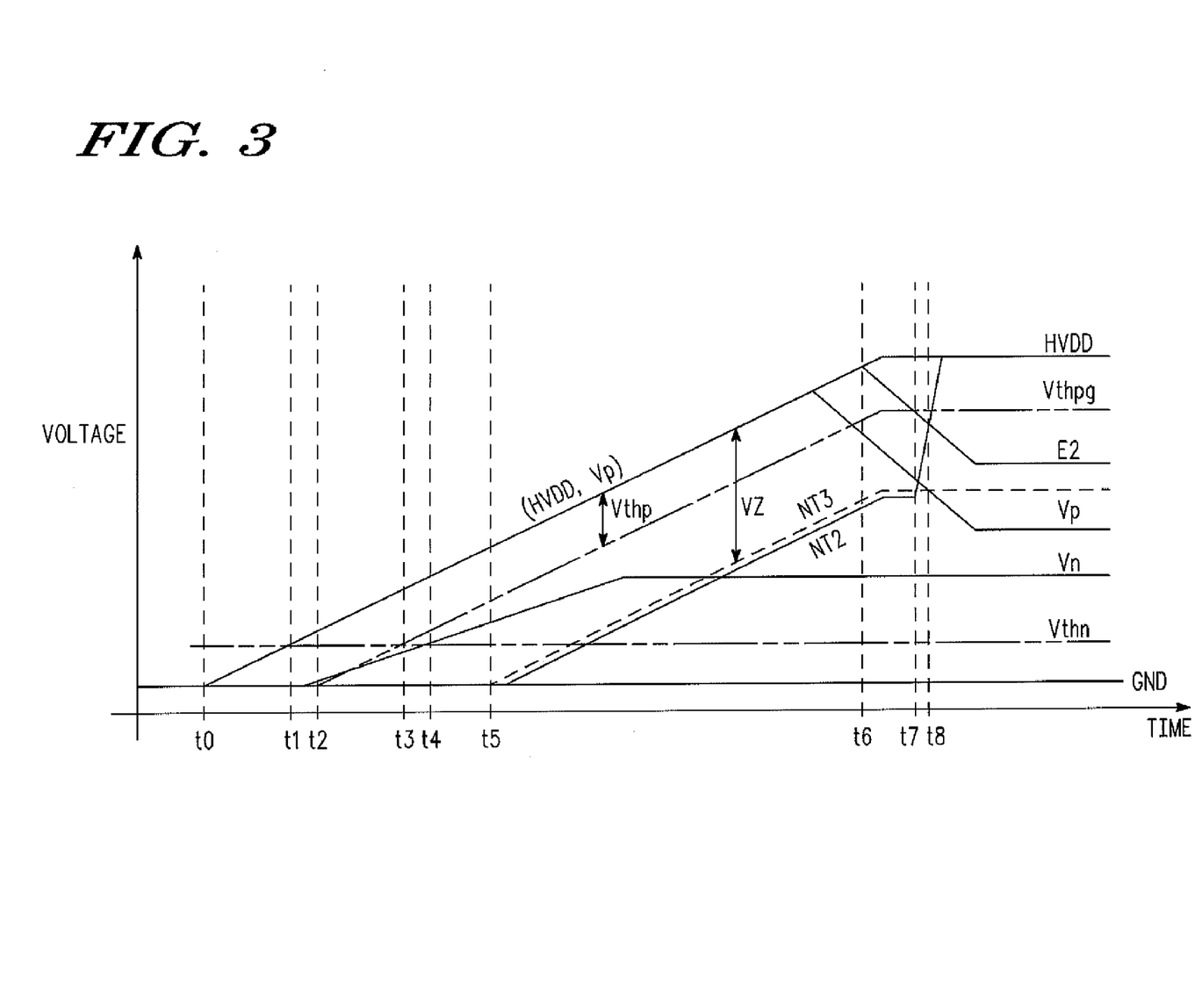
FIG. 3 is a graph showing the voltage-time relationship in the level shifter circuit of the present invention.

When assuming that the power supply of the level shifter circuit 10 is activated at time t0 of FIG. 3, the high potential power supply voltage HVDD, the low potential power supply voltage VDD, the voltage Vp, and the voltage of the input voltage VIN in a high level state start to rise at the same speed. At this stage, voltage exceeding the threshold voltages Vthn and Vthp is not yet generated in the level shifter circuit 10. Each transistor (P10 to P14, P31, P32, P34 to P36, P38, P40 to P42, P51, P52, P54, P55, N10 to N13, N31, N32, N34 to N38, N40 to N42, N51, N52, N54, and N55) of the level shifter circuit 10 is thus deactivated. Therefore, the transistors N41, N42, P42, and P41 connected to both sides of the output terminal of the level shifter circuit 10 are deactivated, and the level shifter circuit 10 maintains the high impedance state.

In this stage, the Zener diode Z1 is in the high impedance state and lower than or equal to the Zener voltage Z. When the capacitance of the capacitor C1 is large and the influence of other parasitic capacitance and the like is small, transfer of charges of the capacitor C1 seldom occur. Thus, the voltages at both ends of the capacitor C1 does not change. As a result, the connection net NT2 maintains the potential of 0 V even if the high potential power supply voltage HVDD increases.

Initially, the high potential enable signal E2 and the high potential disable signal D2 take an intermediate value that is not a high level or a low level. Thus, the transistors P51 and P52 are in the deactivated state or the weakly activated state (high resistance state) in the initial state. Furthermore, the transistors P10 and P11, of which gate terminals receives the high potential enable signal E2 and the high potential disable signal D2, are also initially in the deactivated state or the weakly activated state.

Subsequently, at time t1, the high potential power supply voltage HVDD becomes equal to the threshold voltage Vthn of the n-channel MOS transistor. In this state, the input voltage VIN, the low potential power supply voltage VDD, and the like also become equal to the threshold voltage Vthn.

Further, the transistors N31 and N36 are activated when the input voltage VIN has a high level. When the transistor N36 is activated, the voltage at the drain terminal of the transistor N36 becomes the ground voltage GND. The ground voltage GND is thereby applied to the gate terminal of transistor N41, and the transistor N41 remains deactivated.

The transistors N31 and N36 are not deactivated when the input voltage VIN has a low level (ground voltage GND). Since the low potential power supply voltage VDD is lower than the operation voltage of the inverter 53, the inverter 53 does not operate. Therefore, the transistor N52 remains deactivated, and the output disable signal D1 is not output. Thus, the transistor N40, the gate terminal of which receives the output disable signal D1, remains deactivated. Furthermore, since the output enable signal E1 has a low level, the transistor N37 also remains deactivated.

Therefore, the transistors N36, N37, and N40 connected to the gate terminal of the transistor N41 are all maintained in the deactivated state. As a result, the voltage at the gate terminal of the transistor N41 does not change, and the transistor N41 remains deactivated. At time t1, the voltage Vn does not exceed the threshold voltage Vthn. Thus, the transistors (N34, N35, N38, N42, N54, and N55), the gate terminals of which the voltage Vn is applied to, remain in the deactivated state.

Furthermore, at time t1, the voltage exceeding the threshold voltage Vthp of the p-channel MOS transistor is not generated in the level shifter circuit 10. Thus, the p-channel MOS transistors (P10 to P14, P31, P32, P34 to P36, P38, P40 to P42, P51, P52, P54, and P55) remain in the deactivated state.

In this stage, the level shifter circuit 10 also maintains the output of the high impedance state since the transistor P41 and the transistor N41 are deactivated. The transistors N42 and P42 are also deactivated.

The transistors N12 and N13 of the set circuit 22 are activated since the voltage Vp is greater than or equal to the threshold voltage Vthn of the n-channel MOS transistor in the set circuit 22.

At time t2, the high potential power supply voltage HVDD becomes equal to the threshold voltage Vthp of the p-channel MOS transistor. In this case, the low potential power supply voltage VDD and the voltage Vp are also equal to the threshold voltage Vthp.

Thus, "high potential power supply voltage HVDD-voltage Vp" will not exceed the threshold voltage Vthp of the transistor P12. Therefore, the transistor P12, the gate terminal to which the voltage Vp is applied, remains deactivated in the reset circuit 21. That is, current does not flow to the transistor P12 regardless of the voltage of the enable signals (E1, E2) and the disable signals (D1, D2).

The electrostatic capacitance of the capacitor C1 is sufficiently large. Thus, the voltage at both ends of the capacitor C1 will seldom change even when charges are slightly transferred due to parasitic capacitance and the like. Furthermore, the connection net NT2 is disconnected from the high potential power supply voltage HVDD via the Zener diode Z1. Therefore, the voltage at the connection net NT2 is maintained at 0 V. The connection net NT2 is connected to the input terminal of the latch circuit 23. Thus, a signal having a low level is input to the input terminal of the latch circuit 23.

The connection net NT3, which is connected to the connection NT2 via the transistors N12 and N13, has the same potential as the connection net NT2 and is maintained substantially 0 V since the transistors N12 and N13 are in the activated state. In this state, the inverters 25 and 26 will not normally operate since the high potential power supply voltage HVDD has not yet risen to the voltage required for normal operation of the inverters 25 and 26. The connection net NT4 is maintained at substantially 0 V with respect to the connection net NT2 via the resistor element R1. Thus, the gate terminal of the transistor P14 becomes 0 V. The high potential power supply voltage HVDD is supplied to the source terminal of the transistor P14. Thus, the transistor P14 is activated. Accordingly, the voltage at the connection node PG connected to the drain terminal of the transistor P14 becomes the same as the high potential power supply voltage HVDD. As a result, the high potential power supply voltage HVDD is applied to the gate terminal of the transistor P41 in the input signal level shifter circuit 80. Thus, the transistor P41 is maintained in the deactivated state, and the level shifter circuit 10 maintains the high impedance state.

In FIG. 3, the gate voltage for activating the p-channel MOS transistor having a source terminal to which the high potential power supply voltage HVDD is applied, that is, the voltage lowered by the threshold voltage Vthp from the high potential power supply voltage HVDD, is indicated as a shifting voltage Vthpg.

As described above, the transistors P51, P52, P10, and P11 are initially in the deactivated state or the weakly activated state (high resistance state). If the low potential power supply voltage VDD that rises at the same rising speed as the high potential power supply voltage HVDD does not exceed the greater one of the threshold voltage Vthp and Vthn, the voltages of the output enable signal E1 and the output disable signal D1 also become the intermediate voltage (about threshold voltage Vthp) between the high level and low level. Thus, the transistors N10 and N11 are in the weakly activated state. When the connection net NT1 is smaller than "voltage Vp+threshold voltage Vthp", the leakage current of the transistors P10 and P11 flow through the transistors N10 and N11 and lowers the potential at the connection net NT1.

When the voltage of either the high potential enable signal E2 or the high potential disable signal D2 becomes lower than the high potential power supply voltage HVDD by an amount that is greater than or equal to the threshold voltage Vthp, the transistor (P51 or P52) having the drain terminal to which a signal (E2 or D2) having a low voltage is applied is activated. In this state, the signal (E2 or D2) output from the drain terminal of the activated transistor (P51 or P52) rises with the high potential power supply voltage HVDD at a voltage slightly lower than or substantially equal to the high potential power supply voltage HVDD. The value obtained by subtracting the voltage of the high potential enable signal E2 or the voltage of the high potential disable signal D2 from the high potential power supply voltage HVDD is maintained in a substantially fixed state. Since the transistor (P51 or P52), the drain terminal of which a signal (D2 or E2) having high voltage is applied to, is deactivated, the signal (D2 or E2) having a high voltage is maintained at the same potential.

Subsequently, at time t3, the high potential power supply voltage HVDD and the low potential power supply voltage VDD become equal to the sum of the threshold voltage Vthn and the threshold voltage Vthp. In the preferred embodiment, the electrostatic capacitance of the capacitor C1 is sufficiently larger than the capacitor C2, and the voltage at the connection net NT3 is maintained at 0 V. Thus, the inverters 25 and 26 of the latch circuit 23 are activated. Further, the connection net NT2 connected to the input terminal of the inverter 25 is also 0 V. Thus, a signal having a low level is input to the latch circuit 23. Accordingly, voltage at the output terminal of the inverter 26, that is, the connection net NT4, becomes equal to the voltage (0 V) of the connection net NT3, and the transistor P14 is maintained in the activated state. Thus, the voltage of the connection node PG is maintained at the same voltage as the high potential power supply voltage HVDD, and the transistor P41 remains deactivated.

Furthermore, the inverters 33 and 53 also normally operate since the low potential power supply voltage VDD has been raised in the same manner as the high potential power supply voltage HVDD. Thus, the output disable signal D1 having a low level is output from the inverter 53. The transistor N40, the gate terminal of which is provided with the output disable signal D1, is activated, and the voltage of the drain terminal of the transistor N40 becomes equal to the ground voltage GND. The ground voltage GND is applied to the gate terminal of the transistor N41, and the transistor N41 remains deactivated.

Accordingly, the transistors P41 and N41 are maintained in the deactivated state. Thus, the level shifter circuit 10 maintains the high impedance state even in this stage.

At time t3, the transistor N52, the gate terminal of which is provided with the output of the inverter 53, is activated. However, the transistor N55 connected to the transistor N52 remains in the deactivated state since the voltage Vn applied to the gate terminal is lower than the threshold voltage Vthn.

Subsequently, when the voltage Vn exceeds the threshold voltage Vthn at time t4, the transistors N34, N35, N38, N42, N54, and N55 are activated if the voltage at the source terminal is 0 V. In this case, the output disable signal D1 is provided to the gate terminal and the transistor N40 is activated. Thus, the ground voltage GND is applied to the gate terminal of the transistor N41, and the transistor N41 is maintained in the deactivated state. Furthermore, since the voltage Vn is not used in the high impedance holding circuit 20, the voltage at the connection node PG does not change, and the transistor P41 is maintained in the deactivated state. Thus, the level shifter circuit 10 maintains the output of the high impedance state regardless of the activation and deactivation of the transistor N42.

At time t5, when the high potential power supply voltage HVDD becomes greater than or equal to the Zener voltage VZ, current flows from the cathode to the anode of the Zener diode Z1. Since the transistors N12 and N13 have already been activated, current flows from the drain terminal to the source terminal of the transistors N12 and N13.

Since the voltage at the connection net NT3 is lower than the voltage Vp, the transistor P13 is deactivated. Therefore, the voltage at the connection net NT3 connected to the source terminal of the transistor N13 increases as the high potential power supply voltage HVDD increases. In the preferred embodiment, the electrostatic capacitance of the capacitor C1 is sufficiently larger than the electrostatic capacitance of the capacitor C2. This keeps the voltage at both ends of the capacitor C2 constant.

Specifically, the voltage at the connection net NT3 increases while maintaining a difference of about the Zener voltage VZ from the high potential power supply voltage HVDD. In this case, the Zener voltage VZ is greater than the voltage (greater threshold voltage Vthp) at which the inverters 25 and 26 operate. Thus, the difference between the inverter driving voltage (high potential power supply voltage HVDD) of the inverters 25 and 26 and the inverter reference voltage (voltage at the connection net NT3) of the inverters 25 and 26 becomes greater than the operation voltage of the inverters 25 and 26. Thus, and the inverters 25 and 26 continue to operate.

The voltage at the connection net NT2 subsequently increases as the high potential power supply voltage HVDD increases. Since the transistor N12 is activated, the voltage at the connection net NT2 increases while maintaining the difference of about the Zener voltage from the high potential power supply voltage HVDD. In FIG. 3, the voltage at the connection net NT2 is shown downward from the voltage at the connection net NT3 so that it can be distinguished from the connection net N3. However, the voltage drop caused by the resistor element R1 is subtle in the connection net NT2 since current practically does not flow to the resistor element R1. The capacitor C1 is charged as the voltage at the connection net NT2 increases.

Even if the voltage at the connection net NT2 increases, the voltage at the connection net NT3, which is the reference voltage of the inverters 28 and 26, also increases. Thus, a low level signal is input to the input terminal of the latch circuit 23. Accordingly, the inverter 26 outputs the low level signal, and the voltage at the connection net NT4 becomes equal to the voltage at the connection net NT3. The voltage at the connection net NT3 is lower than a voltage decreased from the high potential power supply voltage HVDD by the threshold voltage Vthp. Thus, the transistor P14 is maintained in the activated state, and the voltage at the connection node PG is maintained at the high potential power supply voltage HVDD. The transistor P41 is maintained in the deactivated state. Since the transistor N40 is maintained in the activated state, the transistor N41 is maintained in the deactivated state. As a result, the level shifter circuit 10 is maintained in the high impedance state.

When the voltage Vp overshoots and then decreases so as to become equal to the shifting voltage Vthpg at time t6, the transistors P12, P13, P34, P35, P38, P42, P54, and P55, the gate terminals of which the voltage Vp is applied to, are activated if the source terminal is the high potential power supply voltage HVDD.

In this state, the transistor P55 is activated when the high potential enable signal E2 and the high potential power supply voltage HVDD increase. In this state, since the transistor N52 is activated, the source terminal of the transistor P55 is connected to the ground voltage GND line via the transistors P55, N55, and N52. Thus, the voltage of the high potential enable signal E2 subsequently decreases to "voltage Vp+threshold voltage Vthp" as the voltage Vp decreases.

Then, the voltage at the connection nets NT2 and NT3 becomes a fixed value when the high potential power supply voltage HVDD reaches a fixed voltage. In this case, the voltage at the anode of the Zener diode Z1 is lower than the shifting voltage Vthpg. Thus, there are no changes in the operation of the latch circuit 23. Accordingly, the transistor P14 is maintained in the activated state, the transistors N41 and P41 are maintained in the deactivated state, and the level shifter circuit 10 is maintained so as to perform output in the high impedance state.

When the voltage of the high potential enable signal E2 decreases and becomes equal to the shifting voltage Vthpg of the transistor P51 at time t7, the transistor P51 is activated. Subsequently, the high potential enable signal E2 and the high potential disable signal D2 respectively provide the low level signal or the high level signal based on the output enable signal E1 to the input signal level shifter circuit 80 at a normal value. Accordingly, the transistor P40 is activated, the high potential power supply voltage HVDD is applied to the gate terminal of the transistor P41, and the transistor P41 is maintained in the deactivated state.

In this state, the transistor P11 of the reset circuit 21 of the high impedance holding circuit 20 is activated, and the voltage at the connection net NT1 becomes equal to the high potential power supply voltage HVDD. The transistor P12 is activated since the source terminal of the transistor P12, the gate terminal of which voltage lower than the shifting voltage Vthpg is applied to, becomes the high potential power supply voltage HVDD. Thus, the drain terminal of the transistor P12 becomes the high potential power supply voltage HVDD via the transistor P11. The voltage at the connection net NT2 increases to the high potential power supply voltage HVDD and charges the capacitor C1. As a result, the voltage at the connection net NT2 suddenly increases. The voltage at the connection net NT2 becomes greater than the voltage Vp. Thus, the transistor N12 of the set circuit 22 is deactivated and the connection net NT2 is disconnected from the anode of the Zener diode Z1.

At time t8, the voltage at the connection net NT2 exceeds the shifting voltage Vthpg. This provides a high level signal to the inverter 25 of the latch circuit 23. The inverter 25 thus provides the low level signal to the inverter 26, and the inverter 26 provides the high level signal to the gate terminal of the transistor P14. The inverter 26 uses the high potential power supply voltage HVDD as the high level signal. Thus, the high potential power supply voltage HVDD is applied to the gate terminal of the transistor P14. This deactivates the transistor P14 and disconnects the connection node PG from the high potential power supply voltage HVDD line.

The connection net NT4 is connected to the input terminal of the inverter 25 via the resistor element R1. Thus, when provided with the high level signal, the latch circuit 23 maintains the high level signal thereafter, and the transistor P14 is maintained in the deactivated state when the power supply is activated. That is, while the power supply is activated, the high potential power supply voltage HVDD is not provided to the gate terminal of the transistor P41 via the connection node PG. The high potential enable signal E2 subsequently controls the input signal level shifter circuit 80 with a high level signal having a predetermined voltage. Thus, a high impedance state output or an output corresponding to the input signal are performed in accordance with the output enable signal E1.

Subsequently, the transistor P54 is deactivated when the high potential disable signal D2 falls, and the voltage of this signal becomes lower than "voltage Vp+threshold voltage Vthp". The high potential disable signal D2 maintains a value higher than the voltage Vp. Thus, the gate withstand voltage of the transistor P54 can be lowered.

The operation after the voltage is sufficiently raised will now be described. In this case, the voltage Vn is a fixed value and the n-channel MOS transistors (N34, N35, N38, N42, N54, and N55), the gate terminals of which the voltage Vn is applied to, are always activated if the source terminal is the ground voltage GND. The voltage Vp is a fixed value, and the p-channel MOS transistors (P34, P35, P38, P42, P54, and P55), the gate terminals of which the voltage Vp is applied to, are always activated if the source terminal is the high potential power supply voltage HVDD.

When a low level signal is output, the output enable signal is set to the high level so as not to be in the high impedance state. Specifically, the output enable signal E1 is set to the low potential power supply voltage VDD having a high level. As a result, in the enable signal level shifter circuit 50, the high potential enable signal E2 becomes the high potential power supply voltage HVDD having a high level, the output disable signal D1 becomes the ground voltage GND having a low level, and the high potential disable signal D2 becomes the voltage having a low level ("voltage Vp+threshold voltage Vthp").

The input signal is set to a low level. Specifically, the input voltage VIN is set to the ground voltage GND having a low level. Thus, the transistor N31 is deactivated, and the transistor N32 is activated via the inverter 33. If the transistor N32 is activated, the voltage of the drain terminal of the transistor P32 becomes "voltage Vp+threshold voltage Vthp" via the transistors N35 and P35. As a result, the gate terminals of the transistors P31 and P36 become "voltage Vp+threshold voltage Vthp", and the transistors P31 and P36 are activated.

Since the transistor P31 is activated, the high potential power supply voltage HVDD is applied to the drain terminal of the transistor P31 and the gate terminal of the transistor P32. As a result, the transistor P32 is deactivated.

Since the transistor P36 is activated, the voltage of the drain terminal of the transistor P36 becomes the high potential power supply voltage HVDD. The high potential power supply voltage HVDD is thus applied to the gate terminal of the transistor P41, and the transistor P41 is deactivated.

The input voltage VIN having a low level is applied to the gate terminal of the transistor N36. The transistor N36 is then deactivated.

Since the transistors P36 and P38 are activated, the voltage (voltage of source terminal of the transistor N38) at the drain terminal of the transistor N37 is "voltage Vn−threshold voltage Vthn". The output enable signal E1, which is the low potential power supply voltage VDD having a high level, is provided to the gate terminal of the transistor N37 and the transistor N37 is activated. As a result, the voltage of the source terminal of the transistor N37 becomes the voltage ("low potential power supply voltage VDD−threshold voltage Vthn") that sufficiently activates the transistor P41. In this case, the output disable signal D1 is at the ground voltage GND having a low level. Thus, the transistor N40 is in the deactivated state.

Accordingly, "low potential power supply voltage VDD−threshold voltage Vthn" is applied to the gate terminal of the transistor N41, and the transistor N41 is activated, and the drain terminal of the transistor N41 becomes the ground voltage GND.

In this manner, in the level shifter circuit 10, the transistor P41 is deactivated and the transistor N41 is activated. Thus, the output voltage VOUT becomes the ground voltage GND.

Accordingly, the level shifter circuit 10 outputs the output voltage VOUT (ground voltage GND) having a high level corresponding to the input voltage VIN having a low level.

When a high level signal is output, the output enable signal E1 is set to the high level to avoid the high impedance state in the same manner as when a low level signal is output. The input signal is set to the high level. Specifically, the input voltage VIN is set to the low potential power supply voltage VDD having a high level. Thus, the transistor N31 is activated. The output from the inverter 33 becomes the ground voltage GND having a low level. Thus, the transistor N32 is deactivated.

Since the transistor N31 is activated, "voltage Vp+threshold voltage Vthp" is applied to the drain terminal of the transistor P31 and the gate terminal of the transistor P32, and the transistor P32 is activated. When the transistor P32 is activated, the drain terminal of the transistor P32 becomes the high potential power supply voltage HVDD, the gate terminals of the transistors P31 and P36 become the high potential power supply voltage HVDD, and the transistors P31 and P36 are deactivated. In this state, the transistor P40 is also deactivated since the high potential enable signal E2 is the high potential power supply voltage HVDD having a high level.

The input voltage VIN having a high level is applied to the gate terminal of the transistor N36. Thus, the transistor N36 is activated. The drain terminal of the transistor N36 then becomes the ground voltage GND. The output enable signal E1 is the voltage having a high level. Thus, the transistor N37 is activated. The voltage at the drain terminal of the transistor P36 becomes "voltage Vp+threshold voltage Vthp" via the transistors N36 and N37. Therefore, the gate terminal of the transistor P41 connected to the drain terminal of the transistor 36 becomes "voltage Vp+threshold voltage Vthp". This activates the transistor P41, the voltage at the drain terminal of the transistor P41 becomes the high potential power supply voltage HVDD.

The transistor N40 is deactivated since the output disable signal D1 has a low level. The voltage at the gate terminal of the transistor N41 then becomes equal to the voltage (ground voltage GND herein) at the drain terminal of the transistor N36. As a result, the transistor N41 is deactivated.

In this manner, in the level shifter circuit 10, the transistor P41 is activated and the transistor N41 is deactivated. Thus, the output voltage VOUT becomes the high potential power supply voltage HVDD. Therefore, the level shifter circuit 10 outputs the output voltage VOUT (high potential power supply voltage HVDD herein) having a high level corresponding to the input voltage VIN having a high level.

The high impedance state will now be described. In this case, the output enable signal E1 is set to a low level. Specifically, the output enable signal E1 is set to the ground voltage GND having a low level. In the enable signal level shifter circuit 50, the high potential enable signal E2 then becomes "voltage Vp+threshold voltage Vthp" having a low level, the output disable signal D1 becomes the low potential power supply voltage VDD having a high level, and the high potential disable signal D2 becomes the high potential power supply voltage HVDD having a high level.

The high potential enable signal E2 is a voltage ("voltage Vp+threshold voltage Vthp") having a low level signal. Thus, the transistor P40 of which gate terminal is provided with such signal is activated. Then, the voltage at the drain terminal of the transistor P40 becomes the high potential power supply voltage HVDD via the transistor P40. The output enable signal E1 has a low level. Thus, the transistor N37 is in the deactivated state and current does not flow through the transistor P40. Therefore, a state in which the high potential power supply voltage HVDD is applied to the gate terminal of the transistor P41 is maintained, and the transistor P41 is deactivated.

Further, the transistor N37 is deactivated, and the output disable signal D1 has the voltage (low potential power supply voltage VDD) of the high level signal. This activates the transistor N40, and the voltage at the drain terminal of the transistor N40 becomes the ground voltage GND. Therefore, the voltage at the gate terminal of the transistor N41 becomes the ground voltage GND, and the transistor N41 is deactivated.

In this manner, the transistors N41 and P41 are deactivated in the level shifter circuit 10, and the level shifter circuit 10 enters the high impedance state.

In the high impedance state, the transistors P40 and N40 are activated. Thus, the high impedance state is maintained even if the transistors P36 and N36 respectively connected to the gate terminals of the transistors P41 and N41 are activated and deactivated in accordance with the input voltage VIN.

The preferred embodiment has the advantages described below.

In the preferred embodiment, the voltage from the high impedance holding circuit 20 is applied to the gate terminal of the transistor P41 between the high potential power supply voltage HVDD line and the output terminal via the connection node PG. The high impedance holding circuit 20 includes the set circuit 22 for setting the latch circuit 23 when the high potential enable signal E2 and the high potential disable signal D2 do not generate a signal for a normal operation, such as when the power supply is being activated, and the signals E2 and D2 are close to the high potential power supply voltage HVDD. Furthermore, the high impedance holding circuit 20 includes the reset circuit 21 for resetting the latch circuit 23 when the enable signal level shifter 50 performs a normal operation and the high potential enable signal E2 or the high potential disable signal D2 shifts to a low level. The gate terminal of the transistor P14 of the latch circuit 23 is 0 V when the high potential power supply voltage HVDD becomes greater than or equal to the threshold voltage Vthp of the p-channel MOS transistor. Thus, the transistor P14 is activated. As a result, the high potential power supply voltage HVDD is applied to the gate terminal of the transistor P41 of the input signal level shifter circuit 80. As a result, the transistor P41 is maintained in the deactivated state, and the level shifter circuit 10 is maintained in the high impedance state. In a transitional period such as during activation of the external power supply, the transistor P40 is maintained in the deactivated state even if the high potential power supply voltage HVDD is not sufficiently increased. This further ensures that the high impedance state is maintained. Furthermore, the high potential power supply voltage HVDD is applied to the gate terminal of the transistor P41 to deactivate the transistor P41. Thus, the same high potential power supply potential is applied to the source terminal and the gate terminal of the transistor P41. This suppresses power consumption.

Moreover, when the voltage of the high potential enable signal E2 shifts to a low level (Vp+Vthp) after the high potential power supply voltage HVDD becomes a fixed value, the transistor P4 is activated, and the high potential power supply voltage HVDD is applied to the gate terminal of the transistor P41. In this state, the reset circuit 21 also activates the transistor P11. Thus, the voltage at the connection net NT2 becomes the high potential power supply voltage HVDD. As a result, the high level signal is provided to the input terminal of the latch circuit 23, and the transistor P14 is deactivated. Further, the high impedance holding circuit 20 stops the application of the high potential power supply voltage HVDD to the gate terminal of the transistor P41 via the connection node PG. Subsequently, the level shifter circuit performs output in the high impedance state or in correspondence with the input signal according to low level or high level of the output enable signal E1.

In the preferred embodiment, the resistor element R1 is connected to the input terminal of the inverter 25 and the output terminal of the inverter 26 so as to be parallel to the inverters 25 and 26, which are connected in series in the latch circuit 23. Thus, even if the voltage of the high potential power supply voltage HVDD is low and the inverters 25 and 26 of the latch circuit 23 do not operate, the voltage at the gate terminal of the transistor P14 is decreased via the resistor element R1 to activate the transistor P14 and apply the high potential power supply voltage HVDD to the connection node PG. This maintains the high impedance state.

Further, when the high level signal is provided from the reset circuit 21, the high level signal may be maintained. Thus, the high impedance holding circuit 20 continues to stop the application of the high potential power supply voltage HVDD to the transistor P40 after the transistor P40 starts control. In this case, the level shifter circuit 10 smoothly performs output in the high impedance state or in correspondence with the input signal according to the output enable signal and the output disable signal.

In the preferred embodiment, the drain terminal of the transistor P12 of the reset circuit 21 and the source terminal of the transistor N12 of the set circuit 22 are connected via the connection net NT2. The voltage Vp is applied to the gate terminals of the transistors P12 and N12. Thus, in the reset circuit 21, the transistor N12 is deactivated when the transistor P12 is activated and the voltage at the connection net NT2 becomes high potential power supply voltage HVDD. The anode of the Zener diode Z1 is thus disconnected from the connection net NT2. Thus, current does not flow through the Zener diode Z1, and the high level signal is provided to the latch circuit 23 while reducing current consumption.

In the preferred embodiment, the cathode of the Zener diode is connected to the high potential power supply voltage HVDD line and the anode of the Zener diode Z1 is connected to the connection net NT2 via the transistor N12. When the high potential power supply voltage HVDD becomes equal to the ground voltage GND, the voltage at the connection net NT2 also becomes equal to the ground voltage GND, and the Zener diode Z1 disconnects the high potential power supply voltage HVDD line and the connection net NT2 until the high potential power supply voltage HVDD becomes equal to the Zener voltage when the high potential power supply voltage HVDD increases. In the transitional period of the high potential power supply voltage HVDD such as during the activation of the external power supply, the set circuit 22 sets the voltage of the input terminal of the latch circuit 23 to the ground voltage GND and ensures that the low level signal is provided to the latch circuit 23. This ensures that the transistor P14 is activated by the low level signal.

In the preferred embodiment, the Zener diode Z1 is arranged between the high potential power supply voltage HVDD and the connection net NT2. Current flows through the Zener diode Z1 even when voltage that is greater than or equal to the Zener voltage VZ is applied from the cathode to the anode. The Zener diode Z1 used in the preferred embodiment is such that the Zener voltage VZ is greater than the threshold voltage Vthp of the p-channel MOS transistor, enables the latch circuit 23 to operate, and is lower than or equal to the withstand voltage of the latch circuit 23. The anode of the Zener diode Z1 is connected to the connection net NT3, which is the inverter reference voltage line of the two inverters 25 and 26 of the latch circuit 23. Thus, the voltage of the Zener diode Z1 is used as an output having a low level of the inverters 25 and 26 of the latch circuit 23.

The output voltage of the inverter 26 for a low level, that is, the voltage applied to the transistor P14, increases as the high potential power supply voltage HVDD increases while maintaining the voltage difference of the Zener voltage VZ. When a low level signal is input to the latch circuit 23, the voltage at the connection net NT3 is supplied to the gate terminal of the transistor P14, the source terminal of which is connected to the high potential power supply voltage HVDD line. Therefore, the voltage difference between the source terminal and the gate terminal of the transistor P14 can be reduced, and the transistor of which the gate withstanding voltage is not large may be used as the transistor P14.

The Zener voltage Z is greater than the threshold voltage Vthp of the transistor P14. Thus, the voltage having a low level for maintaining the transistor P14 in the activated state is supplied to the gate terminal of the transistor P14 of the latch circuit 23 when the low level signal is input to the latch circuit 23. Therefore, the high potential power supply voltage HVDD is applied to the gate terminal of the transistor P41 while maintaining the transistor P14 in the activated state even if the voltage at the anode of the Zener diode Z1 increases.

In the preferred embodiment, the transistor P13 is arranged between the connection net NT3 and the ground voltage GND line. The source terminal of the transistor P13 is connected to the connection net NT3, and the voltage Vp is supplied to the gate terminal of the transistor P13. The voltage of the transistor P13 decreases when the charges of the capacitor C2 are consumed. When the voltage at the connection net NT3 becomes (Vp+Vthp), the transistor P13 is activated. This connects the connection net NT3 and the ground voltage GND line. Thus, when the voltage of the capacitor C2 serving as the power supply of the latch circuit 23 decreases, the voltage at the connection net NT3 does not become greater than a certain value. This ensures the operational voltage of the latch circuit 23 and stabilizes operation.

In the preferred embodiment, the transistor N13 is arranged between the anode of the Zener diode Z1 and the connection net NT3. The source terminal of the transistor N13 is connected to the transistor P13 via the connection net NT3, and the voltage Vp is supplied to the gate terminal of the transistor N13. When the transistor P13 is activated, the transistor N13 is deactivated. Thus, when the transistor P13 is activated and the voltage Vp becomes too low, unnecessary current is prevented from flowing from the high potential power supply voltage HVDD line to the ground voltage GND line through the anode of the Zener diode Z1 and the transistor P13.

The voltage of the anode of the Zener diode Z1 may become higher than the voltage Vp applied to the gate terminals of the transistors N13 and P13 due to noise or the like of the high potential power supply voltage HVDD. As a result, the voltage at the connection net NT3 of the latch circuit may become high. In this case, the transistor P13 is activated, and the voltage at the connection net NT3 is lowered. Therefore, the voltage at the connection net NT3 in which the transistor P14 is not deactivated is output from the inverter 26 when the low level signal is provided to the input terminal of the latch circuit 23. This ensures that the transistor P14 is maintained in the activated state. Thus, it is further ensured that the high impedance state is maintained.

In the preferred embodiment, the transistor P40 of the input signal level shifter circuit 80 and the transistor P10 of the reset circuit 21 are p-channel MOS transistors, each having a source terminal is connected to the high potential power supply voltage HVDD line and a gate terminal provided with the high potential enable signal E2 and the high potential disable signal D2. Thus, the transistor P10 is activated and deactivated synchronously with the activation and deactivation of the transistor P40. When the transistor P40 operates, the reset circuit 21 provides the high level signal to the latch circuit 23. Thus, the transistor P41 is deactivated and the application of the high potential power supply voltage HVDD from the high impedance holding circuit 20 is stopped. Accordingly, when the transistor P40 that maintains the high impedance state operates, the application of the high potential power supply voltage HVDD from the high impedance holding circuit 20 is synchronously stopped.

In the preferred embodiment, the transistor P11 is arranged in parallel to the transistor P10, and the high potential enable signal E2 is provided to the gate terminal of the transistor P11. Therefore, if the transistors N10 and N11 are deactivated before the high potential disable signal D2 shifts to a low level and activates the transistor P10, the potential of the connection net NT1 is increased via the transistor P11. Therefore, by using the transistor P11 after the voltage is sufficiently increased subsequent to the activation of the power supply, the reset circuit 21 performs resetting before the transistor P10 is activated. This reduces operational delay time when resetting the transistor P14.

In the preferred embodiment, the transistor P12 is arranged between the transistor P11, the gate terminal of which is provided with the high potential enable signal E2, and the connection net NT2 in the reset circuit 21. Thus, even if the high potential enable signal E2 fluctuates and becomes temporarily high, the high level signal is provided from the reset circuit 21 to the latch circuit 23 when the high potential power supply voltage HVDD is not higher than the voltage Vp. This reduces the possibility of the transistor P14 of the latch circuit 23 being activated and further ensures that the high impedance state of the level shifter circuit 10 is maintained.

In the preferred embodiment, the source terminal of the transistor P12 is connected to the high potential power supply voltage HVDD line via the transistors P10 and P11 that are arranged in parallel. Further, the source terminal of the transistor P12 is connected in series to the ground voltage GND line via the transistors N10 and N11. The high potential disable signal D2, the high potential enable signal E2, the output enable signal E1, and the output disable signal D1 are respectively provided to the gate terminals of the transistors P10, P11, N10, and N11. Thus, when the signals E1, E2, D1, and D2 take an intermediate value, the transistors P10 and P11 are in an incomplete state, and the transistors N10 and N11 are in a weakly activated state (high resistance state). In this case, current flows through the transistors N10 and N11 rather than through the transistors P10 and P11. Further, the potential at the connection net NT1 is lowered. Thus, the voltage at the source terminal of the transistor P12 becomes high, and the possibility of the transistor P12 being activated at a timing other than when performing resetting is lowered.

In the preferred embodiment, the capacitor C2 is arranged between the source terminal of the transistor N13 and the high potential power supply voltage HVDD. Thus, the voltage is stabilized in the connection net NT3 of the latch circuit 23, which is affected by noise and current fluctuations.

It should be apparent to those skilled in the art that the present invention may be embodied in many other specific forms without departing from the spirit or scope of the invention. Particularly, it should be understood that the present invention may be embodied in the following forms.

In the preferred embodiment, the transistor N13 is arranged between the anode of the Zener diode Z1 of the set circuit 22 and the connection net NT3, and the transistor P13 is arranged between the connection net NT3 and the ground voltage GND line. The present invention is not limited in such a manner and these transistors may be eliminated as long as the voltage at the connection net NT3 fluctuates within a range in which the transistor P14 is not deactivated even if the voltage is applied to the gate terminal of the transistor P14 as the output of the inverter 26. In this case, the set circuit 22 can be simplified.

In the preferred embodiment, the capacitors C1 and C2 are arranged between the connection net NT2 and the ground voltage GND line and between the connection net NT3 and the high potential power supply voltage HVDD line, respectively. However, the capacitors C1 and C2 may be eliminated if the voltage at the connection nets NT2 and NT3 does not change. This would also enable the set circuit 22 to be simplified.

In the preferred embodiment, the Zener diode Z1 of the predetermined Zener voltage VZ is used to increase the voltage at the connection nets NT2 and NT3 as the high potential power supply voltage HVDD increases in the set circuit 22. However, the present invention is not limited in such a manner, and if the transistor having a large withstanding voltage is used for the transistor P14, the voltage at the connection nets NT2 and NT3 does not need to be increased. In this case, the transistor P14 is not activated even if fluctuation increases in the connection nets NT2 and NT3. Thus, voltage fluctuations may be absorbed, and the capacitors C1, C2 may be eliminated.

In the preferred embodiment, the Zener diode Z1 is used as the release means. However, the present invention is not limited in such a manner, and the release means may be formed by other elements as long as the high potential power supply voltage line and the input terminal of the latch means can be released when necessary. For example, a plurality of diodes and transistors may be connected in series. The Zener diode Z1 serving as the release means and the capacitors C1 and C2 serving as the voltage generating means are arranged in part of the set circuit 22 in the preferred embodiment. However, the release means and the voltage generating means do not have to be arranged in the set circuit 22 and may be incorporated in the latch circuit 23 or arranged anywhere excluding the high impedance holding circuit 20.

In the preferred embodiment, the electrostatic capacitance of the capacitor C1 is assumed to be sufficiently larger than the electrostatic capacitance of the capacitor C2. However, the electrostatic capacitance of the capacitor C2 may be increased as long as actual operation is not affected. In this case, the voltage at both ends of the capacitor C2 increases in accordance with the electrostatic capacitance ratio of the capacitors C1 and C2 at time t5.

In the preferred embodiment, the resistor element R1 connected to the input terminal of the inverter 25 and the output terminal of the inverter 26 is arranged in the latch circuit 23. Instead, the resistor element R1 may be eliminated and the input terminal of the inverter 25 and the output terminal of the inverter 26 may be connected as long as the function of the latch circuit 23 is not affected.

In the preferred embodiment, the transistor N37 is arranged between the source terminal of the transistor N38 and the drain terminal of the transistor N36 so as to further ensure that the high impedance state is maintained. However, the present invention is not limited in such a manner, and other elements such as an analog switch formed by an n-channel MOS transistor and a p-channel MOS transistor may be used as long as the voltage at the gate terminals of the transistors P41 and N41 can be increased when the transistors P41 and N41 are activated.

The present examples and embodiments are to be considered as illustrative and not restrictive, and the invention is not to be limited to the details given herein, but may be modified within the scope and equivalence of the appended claims.

The invention claimed is:

1. A level shifter circuit, including:
   a first output control element formed by a p-channel MOS transistor arranged between an output terminal and a high potential power supply voltage line;
   a second output control element formed by an n-channel MOS transistor arranged between the output terminal and a reference voltage line;
   a first switch element for controlling connection between a gate terminal of the first output control element and the high potential power supply voltage line in accordance with an output enable signal for performing an output corresponding to an input signal; and
   a second switch element for controlling connection between a gate terminal of the second output control element and the reference voltage line in accordance with an output disable signal for realizing a high impedance state;
   wherein when the output enable signal has a high level and the input signal has a high level, a voltage higher than a voltage of the input signal is output from the output terminal, the level shifter circuit being characterized by:
   a high impedance holding means including:
   a set means for applying high potential power supply voltage to the gate terminal of the first output control element when the high potential power supply voltage exceeds a threshold voltage of the first output control element; and
   a reset means for stopping the application of the high potential power supply voltage to the gate terminal of the first output control element when the first switch element starts control.

2. The level shifter circuit according to claim 1 being characterized in that the high impedance holding means includes:
   a latch means including a third switch element formed by a p-channel MOS transistor and arranged between the high potential power supply voltage line and the gate terminal of the first output control element, two inverters connected in series, and a resistor element arranged in parallel to the inverters, the inverter connected to the resistor element having an output terminal connected to a gate terminal of the third switch element; and
   wherein the set means provides a low level signal to the latch means to activate the third switch element, and the reset means provides a high level signal to the latch means to deactivate the third switch element.

3. The level shifter circuit according to claim 2 further being characterized by:
   a voltage generating means for supplying power to the latch means and maintaining voltage at an input terminal of the latch means as voltage having a low level when a power supply is activated; and
   a release means that stops current flow to the inverter reference voltage line when the voltage at the high potential power supply voltage line is higher than the voltage at the inverter reference voltage line of the two inverters of the latch means and causes current to flow to the high potential power supply voltage line when the voltage at the high potential power supply voltage line is lower than the voltage at the inverter reference voltage line;
   wherein the set means includes a first shift element formed by an n-channel MOS transistor having a gate terminal to which constant voltage is applied in a normal state and connected between the release means and the input terminal of the latch means; and
   the reset means further includes a second shift element formed by a p-channel MOS transistor, the second shift element having a drain terminal connected to the input terminal of the latch means and a gate terminal to which the constant voltage is applied.

4. The level shifter circuit according to claim 3 being characterized in that:
   the release means is a Zener diode, wherein the Zener diode has a Zener voltage set to be higher than a threshold voltage of the third switch element and lower than the high potential power supply voltage; and
   the release means has a terminal connected to the first shift element and to the inverter reference voltage line.

5. The level shifter circuit according to claim 4 further being characterized by:
   a third shift element formed by a p-channel MOS transistor arranged between the inverter reference voltage line and the reference voltage line, wherein the third shift element has a gate terminal to which the constant voltage is applied.

6. The level shifter circuit according to claim 5 further being characterized by:
   a fourth shift element formed by an n-channel MOS transistor arranged between the inverter reference voltage line and the terminal of the release means connected to the first shift element, wherein the fourth shift element has a source terminal, which is connected to the input terminal of the latch means, and a gate terminal, to which the constant voltage is applied.

7. The level shifter circuit according to claim 3 being characterized in that:
   the gate terminal of the first switch element is provided with a high potential enable signal that becomes a voltage having a low level when the output enable signal has a low level and becomes a voltage having a high level and being greater than the output enable signal when the output enable signal has a high level;
   the first switch element connects the gate terminal of the first output control element and the high potential power supply voltage line when the high potential enable signal is output as voltage for a low level signal during a normal state; and
   the reset means further includes a reset control element formed by a p-channel MOS transistor, wherein the reset control element has a source terminal connected to the high potential power supply voltage line and a drain terminal connected to the input terminal of the latch means, the gate terminal being provided with a high potential disable signal, which is an inverted signal of the high potential enable signal.

8. The level shifter circuit according to claim 7 characterized in that:

the reset means includes a second reset control element arranged in parallel to the reset control element, wherein the second reset control element has a gate terminal provided with the high potential enable signal.

9. The level shifter circuit according to claim 8 characterized in that:

the drain terminal of the reset control element is connected to a drain terminal of the second reset control element, and two compensation elements formed by n-channel MOS transistors are arranged in series between the drain terminals and the reference voltage line to connect the drain terminals to the reference voltage line; and the compensation elements have gate elements provided with the output enable signal and an output disable signal, which is an inverted signal of the output enable signal.

* * * * *